United States Patent [19]
Lee et al.

[11] Patent Number: 5,949,646
[45] Date of Patent: Sep. 7, 1999

[54] COMPACT COMPUTER HAVING A REDUNDANT AIR MOVING SYSTEM AND METHOD THEREOF

[75] Inventors: Mario J. Lee, Santa Clara; Anthony N. Eberhardt, Los Gatos; Eric R. Eberhardt, San Francisco, all of Calif.

[73] Assignee: Sun Microsystems, Inc., Mountain View, Calif.

[21] Appl. No.: 09/127,258

[22] Filed: Jul. 31, 1998

[51] Int. Cl.⁶ .................................................. H05K 7/20
[52] U.S. Cl. ........................ 361/695; 361/690; 361/694; 361/704; 165/80.3; 165/104.33; 165/104.34; 174/15.1; 174/16.1
[58] Field of Search ...................... 361/690, 695, 361/694, 720, 725; 174/15.1, 16.1; 165/80.3, 122, 126, 185; 454/184

[56] References Cited

U.S. PATENT DOCUMENTS

| | | | |
|---|---|---|---|
| 4,644,443 | 2/1987 | Swensen et al. ........................ | 361/687 |
| 5,202,816 | 4/1993 | DeWilde ................................. | 361/695 |
| 5,361,188 | 11/1994 | Kondou et al. ......................... | 361/695 |
| 5,424,915 | 6/1995 | Katooka et al. ......................... | 361/695 |
| 5,477,416 | 12/1995 | Schkrohowsky et al. .............. | 361/695 |
| 5,481,429 | 1/1996 | Eriksson et al. ........................ | 361/678 |
| 5,527,403 | 6/1996 | Mills ....................................... | 361/695 |
| 5,540,548 | 7/1996 | Eberhardt et al. . | |
| 5,544,012 | 8/1996 | Koike ..................................... | 361/695 |
| 5,743,794 | 4/1998 | Chrysler et al. ........................ | 361/695 |
| 5,800,258 | 9/1998 | Knoop et al. ........................... | 361/695 |

*Primary Examiner*—Leo P. Picard
*Assistant Examiner*—Boris L. Chervinsky
*Attorney, Agent, or Firm*—Blakely Sokoloff Taylor & Zafman

[57] ABSTRACT

A computer having a compact enclosure separated into two cooperative compartments, each having a pair of air fans for cooling electrical heat generating elements located in each compartment, the pair of fans being arranged on common sides of the compartments, one fan serving as a redundant fan on the failure of one of the other fans, the compartments are interconnected on opposite sides relative to the fans by an airflow plenum and separated by an airflow blockage wall in a manner that cooling air introduced into one compartment is circulated through both compartments before being exhausted from the other compartment.

15 Claims, 5 Drawing Sheets

PRIOR ART

COMPACT COMPUTER HAVING A REDUNDANT AIR MOVING SYSTEM AND METHOD THEREOF

BACKGROUND OF THE INVENTION

It is a common practice in the design of large computers, such as workstations and mainframes to provide redundant medium movers to cool the heat admitting electrical elements, such as CPU and memory modules. Such computers are provided with signals and/or alarms to warn in the event of a failure of the medium movers to avoid overheating of the electrical elements. However, because of the desire or need for the computers to operate without interruption for long periods of time on the failure of a medium mover, i.e. fan or blower provided to medium cool the electrical elements, the fan or blower works with one or more companion, i.e. additional units referred to as a redundant arrangement. This design, thus allows the computer to continue to operate uninterrupted in the event of the failure or inoperativeness of one of the fans or blowers of a cooperative group. Such systems are engineered to still provide adequate cooling even on the failure of one of the fans or blowers of a cooperative group. Hereinafter, the term fan is to be understood to refer also to a blower. Also the term medium is to be understood to include air, the preferred medium for workstations, servers and PC computers.

Past designs of such redundant systems, however, were not accomplished without a substantial down side. For one thing, past systems in order to provide necessary airflow required several relatively large plenums to provide for the required air and leakage distribution zones associated with the operation of the fans and to take care of reverse airflow created from failed fans. Other designs required the fans to be placed directly in front of the electrical elements.

There also was the problem of air pressure drop some systems inherently created by a failed fan which again was attempted to be solved by providing a relatively large strategically located plenum. This all required a significant enlargement of the enclosure or cabinet of the computer, and worked against the fundamental demand or interest in computer design for compactness.

As used herein the interest of compactness in terms of computer design has particular reference to allowing the employment of closeness of adjacent electrical elements, in shortening the electrical circuit distances between electrical interface systems and the accommodation of more electrical elements and interconnecting systems for a given enclosure space. Also interest in such compactness refers to the space required for the location and the number of fans needed in a given system and in the open spaces needed to assure efficiency of fan output in effectively conveying airflow to the electrical elements.

Past redundant systems also required the use in certain cases of more than a pair of cooperative fans and a particular reserved area for mounting the fans with the attendant need for more enclosure space. Without these design features the air cooling systems did not give the desired cooling efficiency and prevented or placed limitations on the number of electrical elements that could be cooled for a given cooling capacity of the redundant fan cooling system and enclosure size.

Even with these and the other noted design mandates certain redundant systems would not produce a constant bulk air mass flow on the occurrence of a fan failure and therefore suffered from not being able to utilize the cooling advantage of constant bulk air mass flow. This is because air in such systems is recirculated around the failed fan interfering or interrupting a constant bulk air mass flow.

One example of a prior redundant airmover system that addresses the reverse airflow and leakage problems noted above created by a failed airmover maybe found in U.S. Pat. No. 5,540,548 issued to A. N. Eberhardt et al. on Jul. 30, 1996, entitled "REDUNDANT BLOWER UNIT".

BRIEF DESCRIPTION OF THE INVENTION

With the foregoing in mind, it is an object of the present invention to provide in a computer a redundant electrical element air cooling fan arrangement and method thereof, wherein a compact enclosure is separated into at least two cooperative compartments, each adapted to receive heat generating electrical elements and wherein the number of fans employed, their required operating space and the number and location of required open airflow spaces or areas are kept to a minimum in a manner to obtain a highly efficient and effective air cooling system in a very compact enclosure design.

It is another object of the invention to provide an improved computer electrical element cooling system and method thereof comprising a rectangular shaped compact computer enclosure having two side by side generally identical cooperative compartments for receiving heat generating electrical elements, wherein at least one air cooling fan is arranged in each compartment on one common side thereof, one fan functioning as a redundant fan on the failure of the other fan, and on the sides opposite the common sides a plenum is arranged to interconnect the compartments in a manner that air from the fans is allowed to circulate as a constant bulk air mass flow through the compartments to effectively cool the electrical elements even when because of a fan failure cooling is being provided by only the redundant fan.

It is still another object of the invention to provide in the aforesaid compact computer, a minimum number of fans which are located in a manner to conserve space, which space is further conserved by providing a single relatively minimum area airflow interconnecting plenum between the two compartments, in which the compartments are separated by an airflow blockage wall constructed to allow airflow between the compartments only through the plenum.

It is a further object of the invention to provide a compact computer electrical element cooling system that will allow either a push-pull or a pull-push air cooling fan arrangement.

Another object of the invention is to provide in a compact enclosure of a computer comprising of at least three side by side cooperative compartments each constructed to receive heat generating electrical elements requiring cooling, wherein two of the compartments are designated outside compartments, one having an inlet airflow opening and the other outside compartment an exhaust airflow opening, the two outside compartments are provided with air cooling fans, one fan serving as a redundant fan on the failure of the other, the three compartments being interconnected by two plenums in a manner that the fan associated with the inlet opening forces cooling air into the outside compartment associated therewith and into the non-outside compartment and the fan associated with the exhaust opening forces cooling air into the outside compartment associated therewith and into the non-outside compartment, and wherein the system provides a constant bulk air mass flow in the compartments.

DETAIL DESCRIPTION OF THE INVENTION

Figure 1:
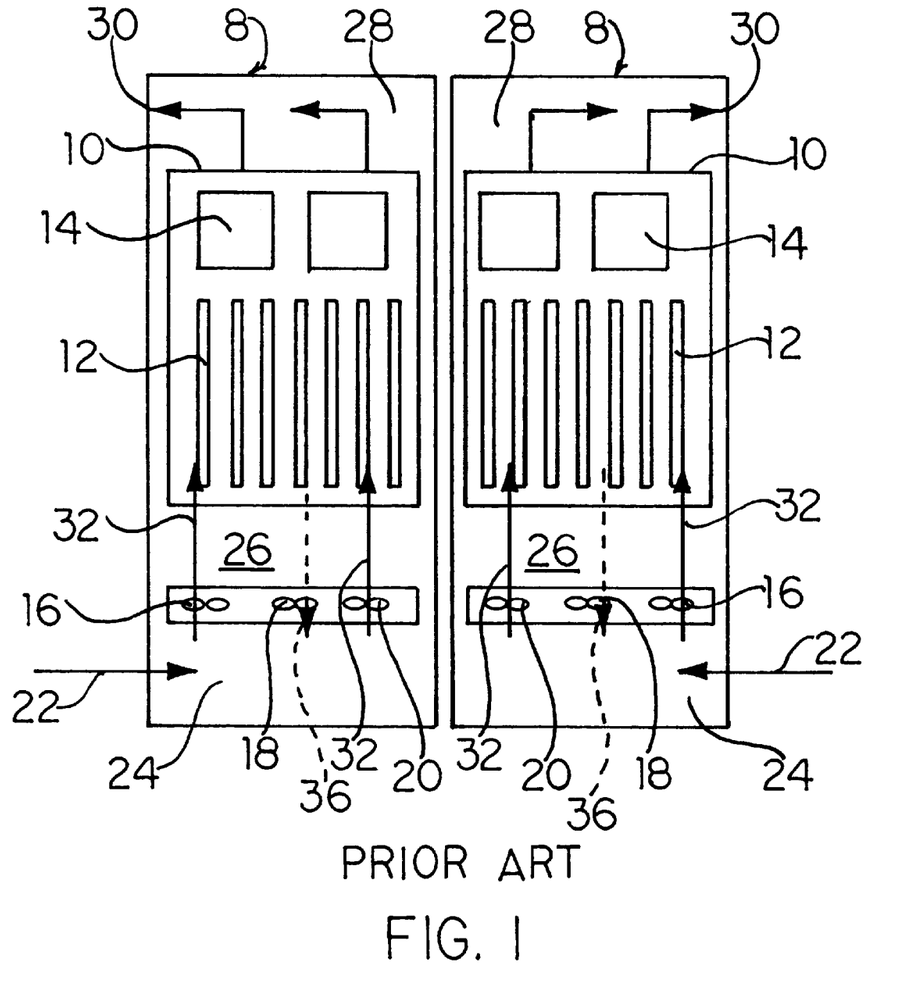
FIG. 1 is a schematic elevational view of a prior art parallel flow redundant electrical element computer air cooling system.
Figure 2:
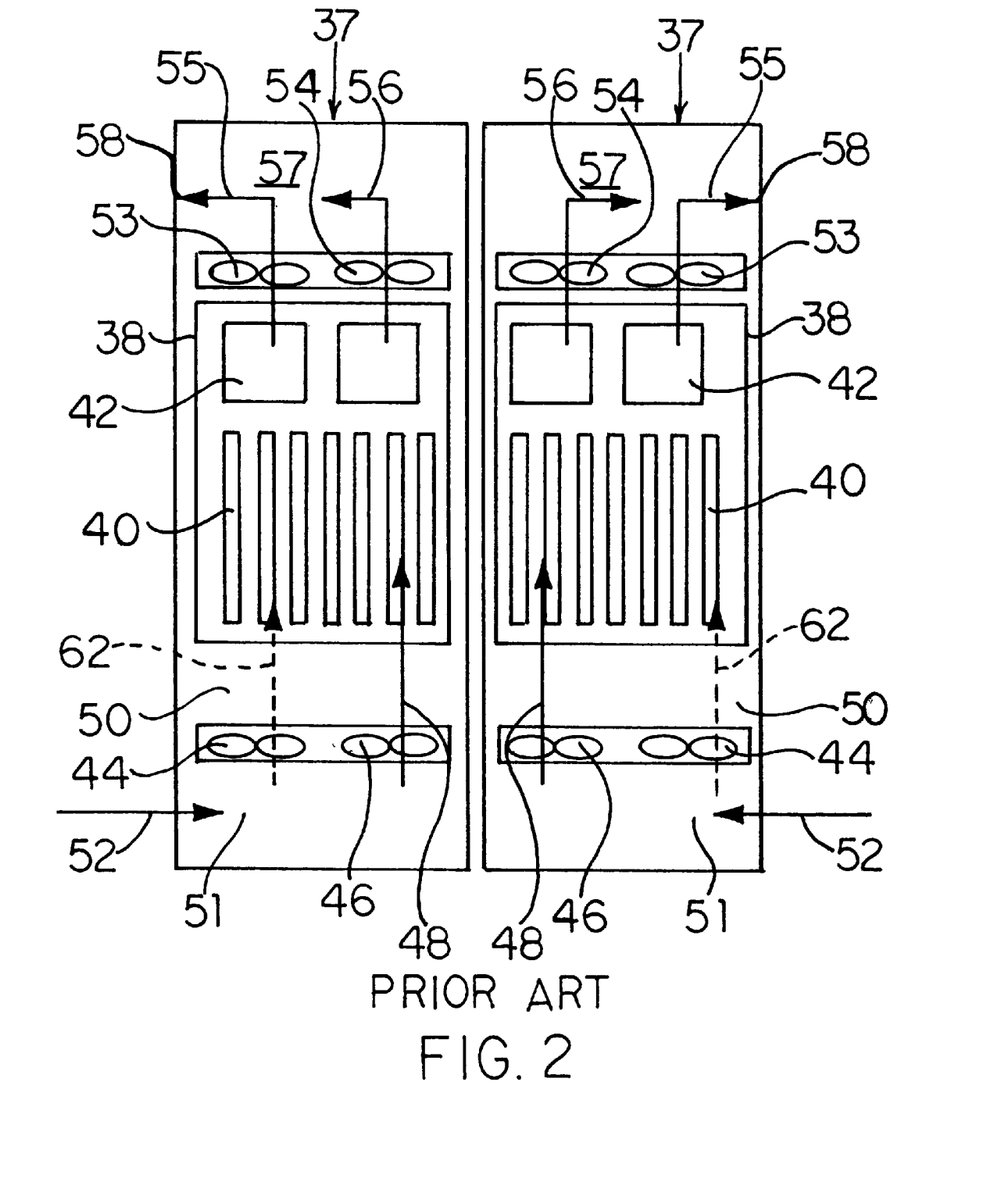
FIG. 2 is a schematic elevational view of a prior art push-pull redundant electrical element computer air cooling system.

In FIGS. 1 and 2, which represent two forms of prior art air cooling redundant computer systems, there is illustrated that these forms employ only a single enclosure having a single compartment for its internal components including its electrical elements. In order to allow a better appreciation of the advantages of the present invention which employs two or more compartments in a single enclosure, the computer systems of FIGS. 1 and 2 for comparison purposes illustrate two side by side enclosures each having their own separate and independent compartment. This will allow the one enclosure—two compartment system of the present invention shown in FIGS. 3 and 5 to be compared with a two enclosure—two compartment system of the prior art shown in FIGS. 1 and 2. The enclosures on the right hand sides of FIGS. 1 and 2 are meant to represent two forms of prior art air cooling redundant computer systems comprised of free standing totally independent units having no physical or common airflow interconnections with the similar adjacent enclosures on the left.

The example of one type of prior art computer system shown in FIG. 1 comprises two separated side by side identical computer enclosures 8 each having two identical compartments 10 for receiving a number of heat generating electrical elements, such as well known memory modules 12 and CPU modules 14. To cool these elements there are arranged in the enclosures 8 outside the compartments 10 and below and spaced from the modules a fan tray for each compartment comprising three fans 16, 18 and 20 per tray. These fans can be of several types commercially available, such as for example a 6.8 diameter×20 Brushless DC No. 6424 designed to produce a maximum airflow of 240 CFM supplied by EBM Industries, Inc. of Farmington, Conn.

The six fans 16–20 receive outside air from inlet openings 22 located at the bottoms of the enclosures 8. Between the fans 16–20 and the inlet openings 22 there are provided plenums 24 that allow the pressure of incoming air to be equalized before being pushed through the enclosure by the fans 16–20. Likewise at the exhaust side of each fan tray distribution plenums 26 are provided to equalize the pressure of the airflow admitting from the fans and before reaching each compartment 10 of the heat generating electrical elements 12 and 14. Above the CPU modules 14 the air exits the enclosures 8 from exhaust plenums 28 having exit openings 30 located on the same sides of the enclosures as the inlet openings 22.

The arrangement of the fans 16–20 in FIG. 1 is known as a parallel flow fan system with an extra redundant fan per tray, in which being a parallel fan system will not produce a constant bulk air mass flow in the compartments 10. When all the fans are operating air is conveyed towards the electrical elements in the direction of the four vertical upwardly pointing arrows 32 associated with the fans. In the event one of the three fans of a set fails, i.e. stops operating for any reason, say for example the fans 18 of the enclosures, the systems will allow air to reverse its normal direction of flow as indicated by the downwardly pointing arrows 36 associated with the fans 18. This condition does not jeopardize the adequate cooling of the electrical elements since the output capacity of the remaining operating fans of each set is designed to be sufficient to provide the necessary airflow and hence to allow the computers to continue to operate without overheating.

While such redundant fan systems are designed to permit the computers to continue to operate without overheating on the failure of one of the fans of each set of three, the reverse airflow from the failed fans 18 necessitates providing extra airflow capacity and the employment of the plenums 24 located between the inlet openings 22 and the fans designed to prevent paths of air from leaking and bypassing the systems completely, in addition to providing adequate space to prevent the choking or restricting of airflow to the fans. The need to provide the plenums 24 requires the enclosures to be substantially enlarged in the vertical direction, as one views FIG. 1. This enlargement may represent an increase of 25% in total enclosure volume. This along with the need to provide the relatively large plenums 24, 26 and 28 and the two sets of three fans result in the disadvantages noted above in obtaining a compact computer design. In sum, for each electrical element compartment there is required a set of three fans and a total of three plenums resulting in a very large enclosure in the vertical direction as one views FIG. 1.

FIG. 2 illustrates a second type of a prior art redundant computer cooling system, characterized by the employment of push-pull fans provided for two identical independent side by side computers. Each computer, as in the case of the computers of FIG. 1, has an enclosure 37 each having two side by side identical compartments 38 for receiving similar heat generating electrical elements of memory 40 and CPU 42 modules. Outside the compartments 38 and below the electrical elements 40 and 42 are located fan trays having pairs of push fans 44 and 46, the two vertical upwardly pointing arrows 48 indicating the normal direction of flow of cooling air for the electrical elements. Between the electrical elements and fans there are provided distribution plenums 50 for equalizing the air pressure of the fans before entering the compartments 37 of the electrical elements. Such plenums may not be required in certain computer air cooling systems employing push-pull fan arrangements of the type shown in FIG. 2. Outside air is received by plenums 51 from inlet openings 52 located at the bottoms of the enclosures 37. Above the electrical elements of each compartment 38 a second fan tray is located consisting of a pair of pull fans 53 and 54, the arrows 55 and 56, respectively, indicating their normal flow of cooling air. The fans 53–54 acting as pull or exhaust fans pass heated air into third plenums 57 where the heated air is discharged from the enclosures 37 through exhaust openings 58 located at the tops of the enclosures 37 on the same sides of the enclosures as the inlet openings 52. The fans 44–46 and 53–54 can be of the type described for the computer in FIG. 1.

In this computer system each set of fans includes one that functions as a redundant fan. Hence, a total of eight fans are required for the combined two computer system in order to compensate for the possibility of having a failed fan for each fan set and still provide the required cooling capacity. The two fan trays and the three plenums per enclosure require a substantial increase in the vertical height of the enclosures and a design that is not conducive to the accommodation of the maximum number of electrical elements for a minimum enclosure space, as will become more apparent when compared with the computers of FIGS. 3 and 5. As in the case of the computers in FIG. 1, a failed fan of the trays in FIG. 2 requires providing extra cooling capacity due to the need to employ the three plenums 50, 51 and 57. In FIG. 2 the arrows 62 associated with the fans 44, indicate failed fans and the dash-dash lines are meant to suggest the resulting reduced flow of air and dead air zones directly behind the hubs of the fans necessitating the providing of the plenums 50 and 51. Such a system places limitations on the design choices for placement of all the electrical elements requiring cooling that are received by the compartments.

Figure 3:
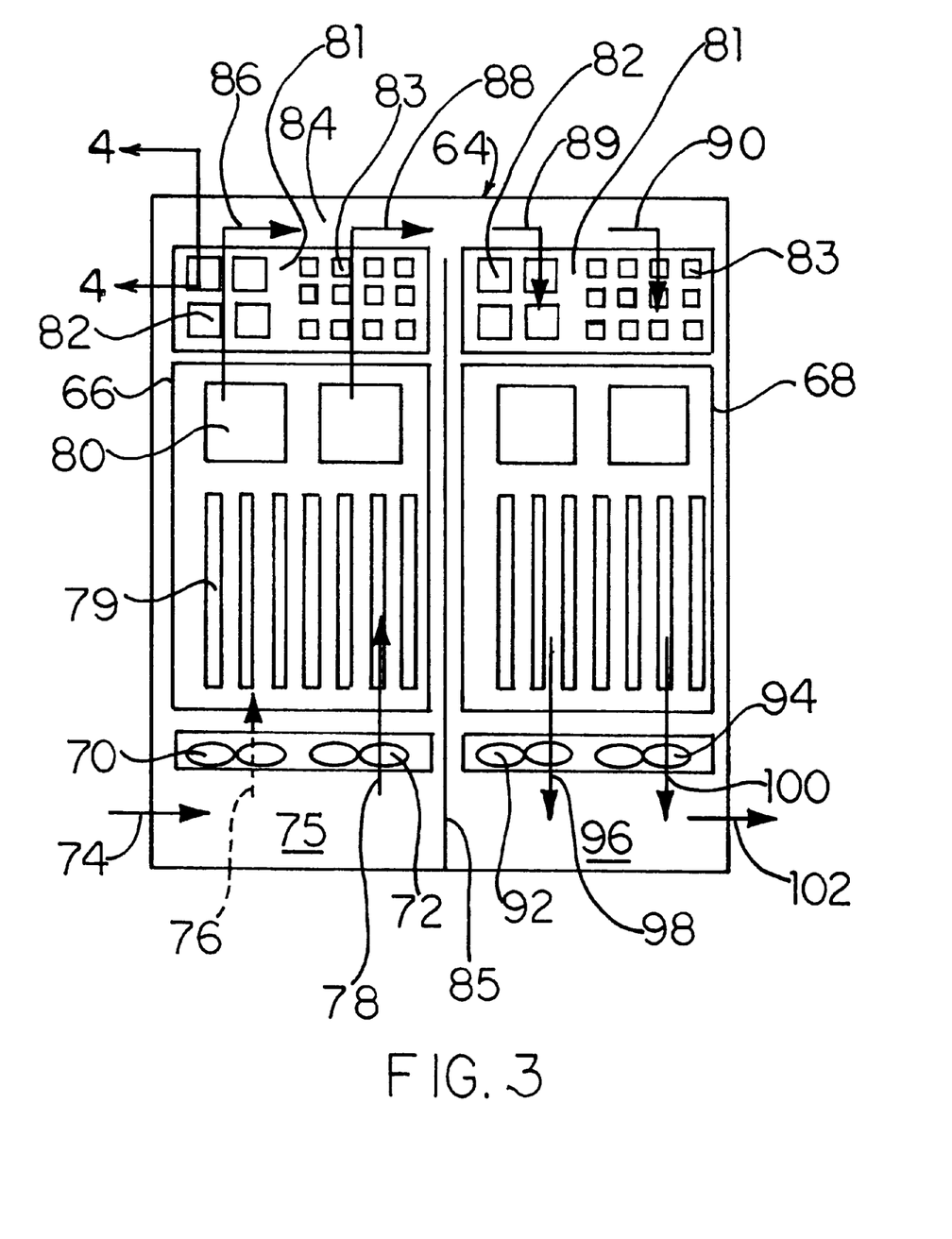
FIG. 3 is a schematic elevational view of a redundant electrical element computer air cooling system of a compact design with two cooperative compartments of a push-pull fan arrangement in accordance with the present invention.
Figure 4:
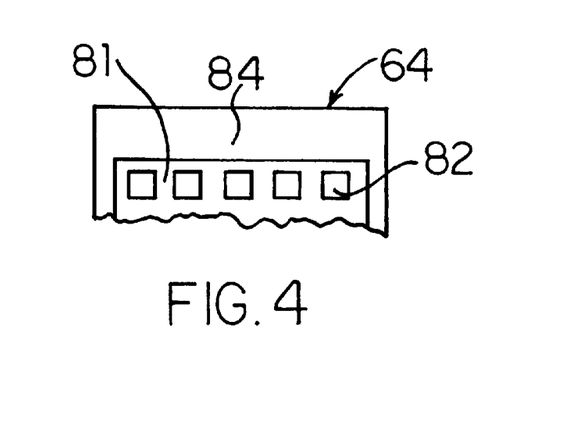
FIG. 4 is a sectional view taken on lines 4—4 of FIG. 3 illustrating particularly the transverse shape and relative dimensions of the plenum that interconnects the two compartments illustrated in the FIG. 3 embodiment.

With reference now to FIGS. 3 and 4 illustrating a preferred embodiment of the invention there is shown a computer having an enclosure 64 separated into two side by side vertically arranged generally identical cooperating compartments 66 and 68. The compartment on the left constitutes an air inlet compartment and the one on the right an air exhaust compartment. At the bottom of the air inlet compartment 66 a fan tray comprising two push fans 70 and 72 receive outside air from an inlet opening 74 after passing into an inlet plenum 75. The function of this plenum is to allow the pressure of the incoming air to equalize. The arrows 76 and 78 associated with the fans indicate the paths of airflow of the fans, the arrow 76 serving to indicate a failed fan 70, the dotted lines thereof indicating a reduction in airflow velocity of this fan.

In the design of the redundant fan system there is provided at least one additional fan to maintain the fan capacity at a desired minimum level on the incident of a fan failure. On the failure of a fan, the relationship of the remaining operating fans to each other and to their associated compartments is such that the remaining operating fans provide a constant bulk air mass flow through the connected compartments. As an example, in the case where there is only one fan per compartment on the failure of one of the fans the other fan, i.e. the redundant fan, will continue to provide a constant bulk air mass flow to cool the electrical elements of the two compartments. In the case of the computers of FIGS. 3 and 5 each fan cooling system includes a single redundant fan, the operation of which on a fan failure along with the other operating fans, will assure a constant bulk air mass flow.

Arranged directly above the fans 70 and 72 is the compartment 66 which receives electrical heat generating elements such as well known memory 79 and CPU 80 modules. The added enclosure space allowed by the compact design is represented by the area 81 into which is located additional electrical elements requiring cooling, such as input/output units 82 and buffer memory units 83. At the top of the compartment 66 above the area 81 there is provided a horizontally arranged plenum 84 that interconnects the two compartments 66 and 68, the compartments being open at their tops to allow unrestrictive airflow to exit from one and enter the other. As best shown in FIG. 4, the side of the plenum 84 extends substantially the full width of the enclosure 64. It will be noted that starting at the bottom of the enclosure 64 an air blocking separating wall or partition 85 is provided to prevent, to the extent practically possible, airflow between the two compartments except at their tops. The wall, which can be made of sheet metal or plastic, terminates short of the top of the enclosure to allow at least a substantial part of the fan cooling air to pass into the adjacent compartment via the plenum 84 and preferably with respect to the compartments to only pass through the plenum. The height of the plenum 84, as shown in both FIGS. 3 and 4, can be kept relatively small since its only function is to convey air from compartment 66 to compartment 68 which is indicated by the four arrows 86, 88, 89 and 90.

The right hand compartment 68 has the same electrical elements indicated as to compartment 66 and which receive cooling airflow at its top, which airflow is forced downwardly through the compartment 68 by a fan tray comprising of two pull fans 92 and 94 located at the bottom of the compartment. The compartment 68 also employs the advantage of the additional area 81 which allows the location of the additional electrical elements 82 and 83. The exiting air from the fans 92 and 94 passes into a plenum 96 as indicated by arrows 98 and 100 where it exits to the outside through exhaust opening 102 located at the bottom of the enclosure 64 on the side thereof opposite the inlet opening 74. As in the case of the computers in FIGS. 1 and 2, one of the fans 70 and 72 and 92 and 94 functions as a redundant fan. Again, as in the case of the earlier illustrated computers, the fan design is such that on the failure of one fan, i.e. the fan 70 for example, the remainder fans are sufficient to effectively cool the electrical elements of the compartments. However, in the case of the computer of FIG. 3 the three remaining operative fans work together to cool both compartments by providing a constant bulk air mass flow.

It will be appreciated from the above that the computer illustrated in FIGS. 3 and 4 for the two compartments need only employ three plenums, i.e. inlet 75, connection 84 and exhaust 96 which are designed to take up a minimum of enclosure space, particularly the connection plenum 84, which compared with the plenums of the prior art illustrated computers is considerably smaller in comparable height. Also the computer of FIG. 3 does not need to employ a distribution plenum between the fans 70–72 and the compartment 66. Thus, both in terms of the overall fan capacity, the number of fans needed, their location and the number of fans available on the failure of a fan, the size of the plenums, the use of a connection plenum and the use of interconnecting cooperative compartments result in a very compact enclosure space that allows a significant increase in the space available for electrical elements and interface systems. Hence, it permits a greater number of electrical elements in the same enclosure space employed by two separate enclosures of the illustrated prior art or it accommodates a significant greater number of electrical elements and systems in a smaller enclosure space.

Both to describe briefly a slightly different embodiment of the two cooperative compartments interconnecting plenum arrangement of FIG. 3 and to give an example of the major dimensions of the different arrangement, and as an example only, the enclosure has an overall size of 720 mm in height, 440 mm in width, with the other two opposite sides measuring 500 mm. The overall power requirements for the electrical elements being considered is 2400 watts, the size of each fan being 172 mm×51 mm rated at 250 CFM per fan, having 9 fans divided into three fans per tray, one tray functioning as a redundant unit, leaving two trays to allow continuous operation of the computer on the occurrence of a fan failure. In this arrangement the third fan tray is arranged in tandem with the exhaust fans provided in the exhaust compartment.

Figure 5:
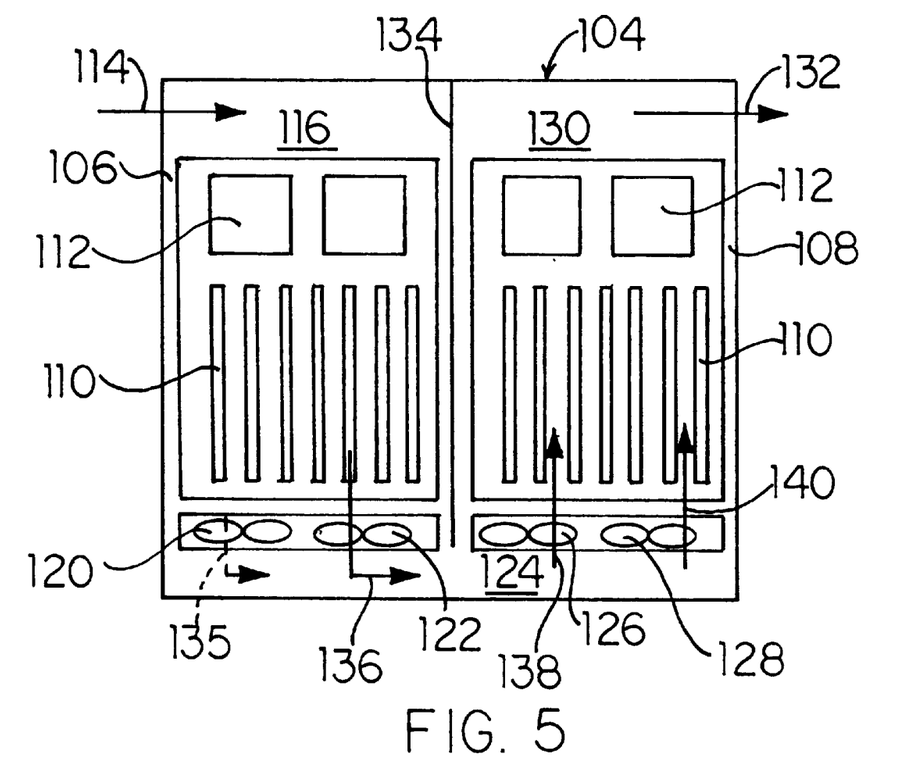
FIG. 5 is a schematic elevational view similar to FIG. 3 of a second embodiment of the present invention but of a pull-push fan arrangement.

With reference now to FIG. 5, the embodiment illustrated may be characterized as a pull-push fan arrangement compared to the push-pull fan arrangement of FIG. 3. While FIG.

3 serves to illustrate the increase in space available for additional electrical elements that may be gained by the invention, FIG. 5 serves to illustrate the reduction in enclosure height or size that may be realized, if the extra area 81 of FIG. 3 is not desired but a reduction in enclosure size is. In FIG. 5 there is shown a computer enclosure 104 divided into two side by side vertically arranged generally identical cooperating compartments 106 and 108. The compartment 106 at the left functions as an inlet airflow compartment, the compartment 108 at the right as an exhaust airflow compartment. Each compartment receives a number of well known heat generating electrical elements, such as memory and CPU modules 110 and 112, respectively. At the top of the compartment 106 there is provided an air inlet opening 114 which introduces airflow into a plenum 116 arranged above the compartment, similar in function to the plenum 75 of FIG. 3. The compartments 106–108, as in the case of the FIG. 3 computer, have openings near their tops to have air pulled in and pushed out, respectively.

The air inlet compartment 106 has a fan tray consisting of two fans 120–122 arranged at its bottom designed to pull air from its top over its electrical elements 110 and 112. Airflow from the fans 120–122 exits the compartment 106 into a horizontally arranged connection plenum 124 that interconnects the two compartments at their bottoms. The side of the plenum 124 extends substantially the full width of the enclosure 104 and is similar in construction to that shown in FIG. 4. Thus, the compartment 108 receives airflow from the plenum 124, which air is pushed into compartment 108 by a fan tray comprising two fans 126 and 128 arranged at the bottom of the compartment 108. These fans and the fans 120–122 can be of the type mentioned above. The pushed cooling airflow from the fans 126 and 128 is forced over the electrical elements 110–112 of compartment 108 to the top of the compartment into a plenum 130 where the heated air is allowed to exit from the compartment by an exhaust opening 132. To assure that the inlet air will be trained to pass through the compartment 106 and not into the compartment 108, except at their bottoms an air blocking separating wall or partition 134 is provided, similar in function to the wall 85 in FIG. 3, which extends from the top of the enclosure 104 to the bottom of the compartments short of the bottom of the enclosure, thus, allowing the interflow of cooling air between the compartments only at their bottoms. In FIG. 5, the fan 120 is indicated to be a failed fan by the fan airflow directional arrow 135, which when compared with fan airflow directional arrows 136, 138 and 140 suggests a reduced airflow velocity by the dash lines that make up the arrow. As in the computer of FIG. 3, the cooperative relationship between the operative fans functions to cool both compartments which results in the advantage of providing a minimum number of fans even considering the increase capacity of the two cooperative compartment design.

It will be appreciated that in both the compact enclosure arrangements of FIGS. 3 and 5 the disadvantages of the illustrated prior art computer systems noted above of dead air zones, the need to place the electrical elements directly in front of the fans, the need to provide extra airflow capacity due to fan failure, and the air leakage and air bypass problems have been eliminated or substantially reduced. In addition, because of how the compartments, the fans and the plenums are arranged and related to each other the air cooling systems of FIGS. 3 and 5 will produce a constant bulk air mass flow of cooling air throughout the two compartments, both during operation of all fans and when there is a fan failure and the redundant fan and the other operating fans are supplying cooling air. It will also be appreciated that while the enclosure arrangements of FIGS. 3 and 5 incorporate fan trays having two fans, other forms of the invention may use only one fan, per compartment or three or more per compartment. Also, instead of two cooperative compartments an enclosure may utilize more than two side by side compartments having a continuous interconnecting airflow path.

Figure 6:
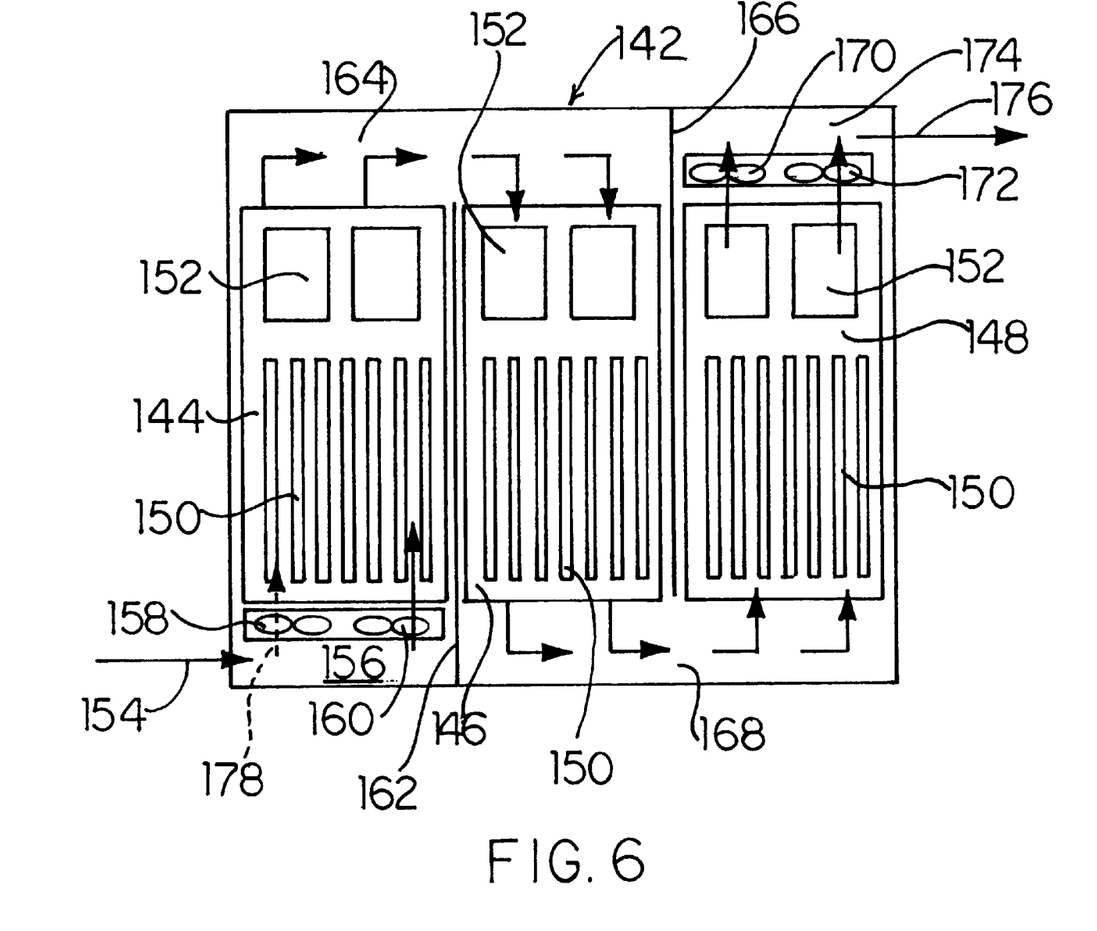
FIG. 6 is a schematic elevational view similar, in part, to FIG. 3 of a third embodiment of the invention illustrating a three cooperative compartment arrangement.

In FIG. 6 an enclosure 142 is illustrated comprising three side by side vertically arranged generally identical cooperative compartments 144, 146 and 148. While the compartments have the same heights, one of the compartments, for example, compartment 146 may be identical to the other compartments or may be somewhat smaller in width should less space for electrical elements be needed. Each compartment receives a selection of heat generating electrical elements such as well known memory 150 and CPU 152 modules. The enclosure 142 for the compartment 144 has an inlet opening 154 at its bottom where outside cooling air is introduced into a plenum 156 where it equalizes and is then forced over the electrical elements 150 and 152 by a fan tray having two push fans 158 and 160 arranged immediately below the elements. The plenum 156 has the same functions as the inlet plenums of FIGS. 3 and 5.

To prevent incoming air from passing into the next adjacent compartment 146 except at its top an air blockage separating wall 162 is provided. The wall extends from the bottom of the enclosure and terminates short of its top thus allowing cooling air from fans 158 and 160 to only enter a relatively small i.e. short horizontally arranged connection plenum 164. The plenum in its width extends substantially the full width of the enclosure and is similar in construction to that shown in FIG. 4. To prevent passage of cooling air from the two adjacent compartments 146 and 148 except at their bottoms a second air blockage separating wall 166 is arranged to extend down from the top of the enclosure 142. The wall 166 extends to a second connection plenum 168 arranged at the bottom of the enclosure, similar in construction to the plenum 164 and located at the bottom of the compartments 146 and 148. The walls 162 and 166 are similar in function to the walls 85 and 134 of FIGS. 3 and 5, respectively.

Thus, cooling air is pushed and pulled through the second compartment 146 over its electrical elements 150 and 152 from one plenum 164 to the other 168. The pulling force comes from a second fan tray comprising two pull fans 170 and 172 located at the top of the third cooperative compartment 148 where there is also provided a plenum 174 and an exhaust opening 176 on the right hand outside side wall of the enclosure 142. The fans 158–160 and 170–172 can be of the type mentioned above with one fan having been added as the redundant fan to the fan system. The several arrows utilized in FIG. 6 indicate the path of the circulating airflow from the inlet opening 154 to the exhaust opening 176, the arrow 178 indicating by its dash lines a failed fan and a reduction in airflow. As in the earlier illustrated computers of FIGS. 3 and 5 on the failure of one of the four fans the remaining operative fans including the redundant fan cooperate to provide the necessary cooling for the electrical elements of the three compartments. As noted in regard to the computers of FIGS. 3 and 5 the cooperative relationship results in the advantage of reducing the number of fans needed. The embodiment of the invention illustrated in FIG. 6 incorporates all the advantages noted above as to the FIGS. 3 and 5 computers.

In accordance with the provisions of the patent statutes we have explained the preferred embodiment of our invention, however it will be understood by those skilled in the art to which the invention pertains that the invention may be practiced otherwise than illustrated or described.

We claim:

1. In a computer comprising two or more heat generating electrical elements requiring cooling, an enclosure, the enclosure comprising at least two adjacent compartments, each adapted to receive at least one of the electrical elements, at least one electrical element air cooling fan for each compartment located inside the enclosure and relative to an associated compartment in a manner to circulate cooling air through the compartments, one fan functioning as a redundant fan on the failure of another fan, one fan of one compartment arranged to introduce cooling air to its associated compartment and the fan of the other compartment arranged to exhaust cooling air from its associated compartment, and a connection plenum interconnecting the two compartments and arranged relative to the fans to allow inlet cooling air from the compartment having air introduced into it to pass cooling air from this compartment to the compartment having the fan for exhausting cooling air after the cooling air has circulated through both compartments.

2. In a computer according to claim 1, the compartments arranged in a side by side relationship to each other, the fans located on common ends of the compartments, the compartments having generally the same distance between their respective fans and the connection plenum, and said connection plenum located relative to the fans on the ends of the compartments opposite the fans.

3. In a computer according to claim 1, the compartments arranged in a side by side relationship to each other, the fans located on common ends of the compartments, the compartments having generally the same distance between their respective fans and the connection plenum, and the connection plenum located relative to the fans on the same ends of the compartments as the fans.

4. In a computer according to claim 1, wherein the fans of said compartments comprise two fans for each compartment, in which at least one of the fans functions as a redundant fan, and wherein the relationship of the compartments, the fans and the plenum allows a constant bulk air mass flow to be circulated throughout the two compartments, both when all fans are operating and when only the redundant fan is operating.

5. In a computer according to claim 2, wherein the fan for the compartment having air introduced into it is constructed to function as a cooling air pull fan and the fan for the other compartment is constructed to fiction as a cooling air push fan.

6. In a computer according to claim 3, wherein the fan for the compartment having air introduced into it is constructed to function as a cooling air push fan and the fan for the other compartment is constructed to function as a cooling air pull fan.

7. In a computer according to claim 6, wherein the enclosure comprises a top and bottom, said fans arranged at the top of the enclosure, and wherein an inlet opening is located at the bottom of the enclosure for the compartment having air introduced into it and an outlet opening is located at the bottom of the enclosure for the other compartment.

8. In a computer according to claim 5, wherein said enclosure comprises a top and bottom, said fans arranged at the bottom of said enclosure, and wherein an inlet opening is located at the top of the enclosure for the compartment having air introduced into it and an outlet opening is located at the top of the enclosure of the other compartment.

9. In a computer according to claim 1, wherein the fan for introducing cooling air is located immediately in front of its associated compartment and arranged in a manner that its cooling air passes directly into its associated compartment.

10. In a computer according to claim 2, including an airflow blockage wall arranged to extend between the compartments in a manner to block fan airflow between the compartments while allowing fan airflow to pass through the plenum.

11. In a computer according to claim 3, including an airflow blockage wall arranged to extend between the compartments in a manner to block fan airflow between the compartments while allowing fan airflow to pass through the plenum.

12. In a computer comprising three or more heat generating electrical elements requiring cooling, an enclosure, the enclosure comprising at least a first, second and third compartments, each having an adjacent relationship with at least one of the other compartments and each adapted to receive at least one of the electrical elements, the second compartment having sides contiguous to a different side of the first and third compartments, at least one electrical element air cooling fan for the first and third compartments located inside the enclosure and relative to an associated compartment in a manner to circulate cooling air through the three compartments, one fan at least functioning as a redundant fan on the failure of another fan, the fan of the first compartment arranged to introduce cooling air to its associated compartment and the fan of the third compartment arranged to exhaust cooling air from its associated compartment, a connection plenum arranged between the first and second compartments and a connection plenum arranged between the second and third compartment in a manner to allow airflow between the three compartments, and fan airflow blockage walls arranged between the first and second compartments and the second and third compartments in a manner to allow airflow between the compartments only through the two plenums.

13. In a computer according to claim 12, wherein the relationship of the compartments, the fans and the plenums allows a constant bulk air mass flow to be circulated through the three compartments, both when all fans are operating and when only the redundant fan is operating.

14. In a computer comprising two or more heat generating electrical means requiring cooling, an enclosure means, the enclosure means comprising at least two adjacent compartment means, each for receiving at least one of the electrical means, at least one electrical means air cooling fan means for each compartment means located inside the enclosure means and relative to an associated compartment means in a manner to circulate cooling air through the two compartment means, one fan means functioning as a redundant fan means on the failure of another fan means, one fan means of one compartment means arranged to introduce cooling air into its associated compartment means and the fan means of the other compartment means arranged to exhaust cooling air from its associated compartment means, a connection plenum means interconnecting the two compartment means and arranged relative to the two fan means to allow inlet cooling air from the compartment means having air introduced into it to pass cooling air from this compartment means to the compartment means having the fan means for exhausting cooling air after the cooling air has circulated through both compartment means, and fan airflow blockage means arranged to extend between the compartment means in a manner to allow with respect to the compartment means at least a substantial part of the fan airflow to pass through the connection plenum means.

15. In a computer according to claim 14, wherein the compartment means, the fan means and the plenum means are arranged and related to each other in such a way to permit circulation of a constant bulk air mass flow of cooling air through both compartments, both when all fan means are operating and when only the redundant fan means is operating.

\* \* \* \* \*